(12) United States Patent
Cheng

(10) Patent No.: US 6,194,297 B1
(45) Date of Patent: Feb. 27, 2001

(54) METHOD FOR FORMING SALICIDE LAYERS

(75) Inventor: Chih-Hung Cheng, Hsinchu (TW)

(73) Assignee: United Microeletronics Corp., Hsinchu (TW)

(*) Notice: Subject to any disclaimer, the term of this patent is extended or adjusted under 35 U.S.C. 154(b) by 0 days.

(21) Appl. No.: 09/246,762

(22) Filed: Feb. 8, 1999

(30) Foreign Application Priority Data

Jan. 19, 1999 (TW) .................................................. 88100748

(51) Int. Cl.[7] .............................................. H01L 21/3205
(52) U.S. Cl. ........................ 438/592; 438/233; 438/595; 438/647
(58) Field of Search .................................. 438/592, 233, 438/647, 595

(56) References Cited

U.S. PATENT DOCUMENTS

| | | | |
|---|---|---|---|
| 4,873,205 | * | 10/1989 | Critchlow et al. . |
| 5,156,994 | * | 10/1992 | Moslehi . |
| 5,683,941 | * | 11/1997 | Kao et al. . |
| 5,686,331 | * | 11/1997 | Song . |
| 5,714,398 | * | 2/1998 | Chao et al. . |
| 5,731,239 | * | 3/1998 | Wong et al. . |
| 5,953,614 | * | 9/1999 | Liu et al. . |
| 6,001,698 | * | 12/1999 | Kuroda . |
| 6,010,954 | * | 9/1998 | Ho et al. . |
| 6,013,569 | * | 1/2000 | Lur et al. . |
| 6,069,044 | * | 5/2000 | Wu . |

* cited by examiner

Primary Examiner—Richard Booth
Assistant Examiner—Lynne Gurley
(74) Attorney, Agent, or Firm—Jiawei Huang; J C Patents

(57) ABSTRACT

A method for fabricating salicide devices over a substrate is described. The substrate has a gate structure pair in which a first gate structure comprises a first gate and a first stuffed film located on the first gate, and a second gate structure comprises a second gate and a second stuffed film located on the first gate. A first spacer is formed on the sidewall of the first gate structure. A second spacer is formed at the sidewall of the second gate structure. The first and the second stuffed films are removed. The second spacer is etched back so as to form a third spacer lower than the second gate. Salicide layers are formed upon the first and the second gates.

6 Claims, 2 Drawing Sheets

METHOD FOR FORMING SALICIDE LAYERS

CROSS-REFERENCE TO RELATED APPLICATION

This application claims the priority benefit of Taiwan application serial no. 88100748, filed Jan. 19, 1999, the full disclosure of which is incorporated herein by reference.

BACKGROUND OF THE INVENTION

1. Field of the Invention

The invention relates to a semiconductor device,, a process for manufacturing such a device, and more particularly, to a process for forming gate spacers.

2. Description of Related Art

In the fabrication of MOS devices on a substrate, the self-aligned silicide (SALICIDE) process is performed to decrease the sheet resistance of the MOS electrodes and the contact resistance of the contact regions between those electrodes.

For decreasing the above mentioned resistances well enough, the salicide process is performed at a high temperature. However, the salicide process cannot be performed as well as required at a temperature of more than about 750° C., especially when the MOS devices comprises a P-type metal oxide semiconductor (PMOS). This is because at such a high temperature, the silicon material in the PMOS gate often oozes out to the spacer adjacent to the gate, and thereby transforms into salicide layers upon the spacer by reacting with the metal layer deposited on the spacer. The salicide layers upon the spacer undesirably, electrically connect the gate with the source/drain regions of the PMOS and often make the PMOS short during operation.

On the other hand, by lowering the temperature to less than about 750° C., it is not easy for other devices, such as an N-type metal oxide semiconductor (NMOS), to form salicide layers upon them, especially when their gate widths are narrowed as the integration of the devices is increased. In addition, the above mentioned resistances cannot be decreased well enough by performing the salicide process at the above temperatures.

SUMMARY OF THE INVENTION

The invention provides a method for fabricating salicide devices. A device pair comprising a first gate structure and a second gate structure is formed on a substrate. The first gate structure comprises a first gate and a stuffed film located on the first gate. The second gate structure comprises a second gate and a stuffed film located on the second gate. A first spacer is formed at the sidewall of the first gate structure, and a second spacer is formed on the sidewall of the second gate structure. The stuffed films are removed, thereby creating a first spacer higher than the first gate. First heavily doped source/drain regions are formed in the substrate adjacent to the first spacer. After the first heavily doped source/drain regions are formed, the first gate and spacer are masked with a photoresist pattern. Second heavily doped source/drain regions are formed in the substrate adjacent to the second spacer. The second spacer is etched back by using the photoresist pattern as an etching mask so as to form a third spacer lower than the second gate. Salicide layers are formed upon the first gate, the second gate, the first heavily doped regions and the second heavily doped regions. The salicide process is performed well at a high temperature of between about 750° C. and 800° C., therefore decreasing the resistance of the MOS electrodes and the contact resistance of the contact regions between those electrodes.

The spacer higher than the first gate prevents the salicide region upon the first gate from laterally growing onto the sidewall of the first gate, especially when the first gate is a PMOS gate.

The spacer lower than the second gate exposes a small, upper part of the sidewall of the second gate so as to leave more sites for forming a gate salicide region thereupon, especially when the second gate is an NMOS gate.

It is to be understood that both the foregoing general description and the following detailed description are exemplary and explanatory only and are not restrictive of the invention, as claimed.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1A:
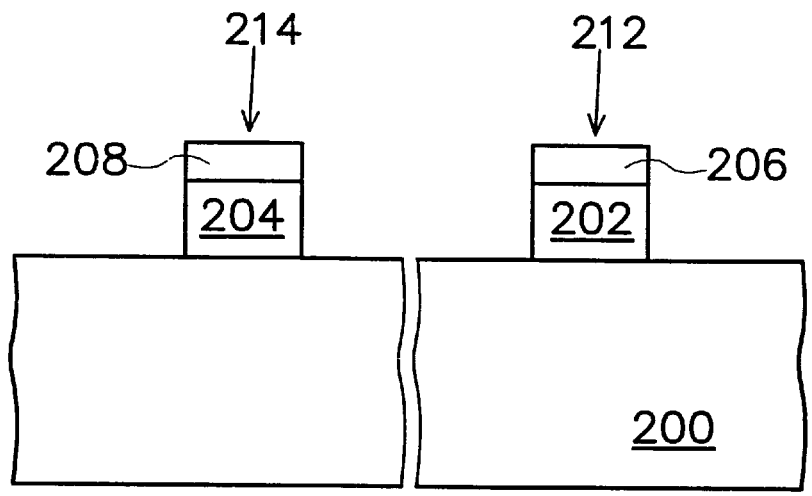
FIGS. 1A–1F are schematic, cross-sectional views illustrating fabrication of semiconductor devices in a preferred embodiment according to the invention

Referring to FIG. 1A, a device pair comprising a first gate structure 212 and a second gate structure 214 is formed on a substrate 200 (e.g. a silicon substrate). The first gate structure 212 comprises a first gate 202 and a stuffed film 206 located on the first gate 202. The second gate structure 214 comprises a second gate 204 and a stuffed film 208 located on the second gate 204. The first gate 202 is, for example, a PMOS gate. The second gate 204 is, for example, an NMOS gate. Moreover, the first and the second gates 202, 204 are, for example, doped polysilicon gates. In this example, the polysilicon gate of the NMOS transistor is typically doped with phosphorus ions.

In addition, the stuffed films 206, 208 are fabricated by, for example, patterning a SiON layer. More specifically, the SiON layer is fabricated by first forming a SiON layer on a conductive layer (not shown) located on the substrate as an anti-reflection layer. The anti-reflection layer is formed to improve the accuracy of the subsequent gate patterning step. As the conductive layer is patterned to form the first and the second gates, the SiON layer is simultaneously patterned to accomplish the desirable stuffed films 206, 208.

Figure 1B:
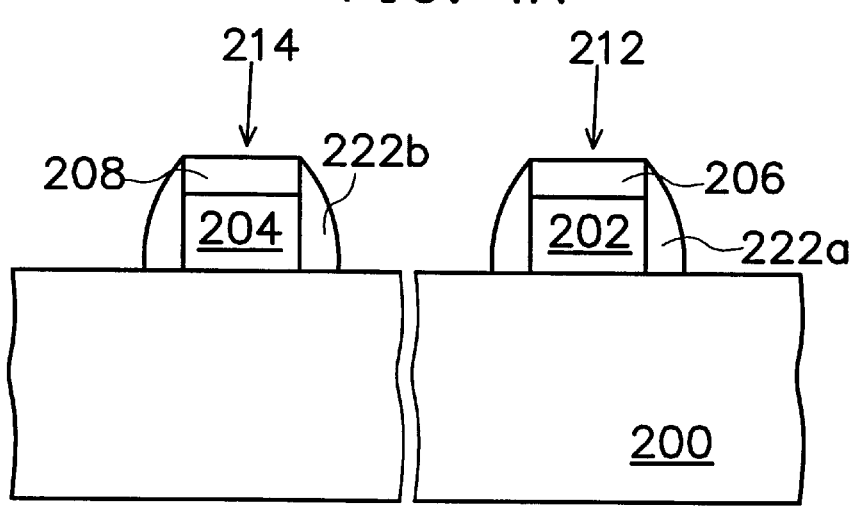

Referring to FIG. 1B, a first spacer 222a is formed on the sidewall of the first gate structure 212, and a second spacer 222b is formed on the sidewall of the second gate structure 214. The first and the second spacers 222a, 222b are formed by, for example, depositing a silicon oxide layer on the substrate and anisotropically etching the silicon oxide layer until the first and the second gate structures 212, 214 are exposed.

Figure 1C:
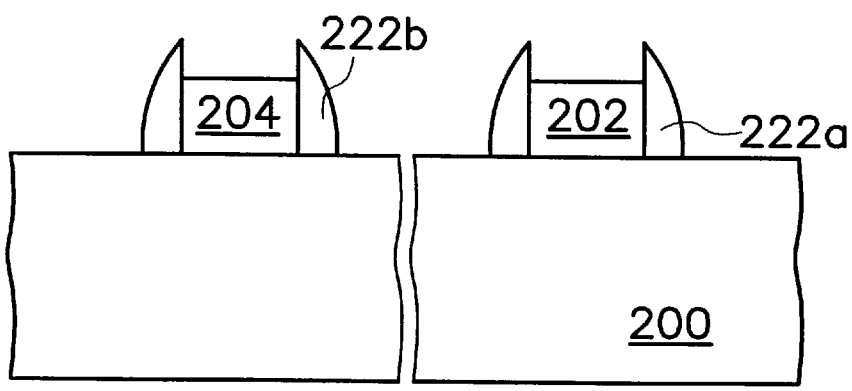

Referring to FIG. 1C, the stuffed films (206, 208 shown in FIG. 1B) are removed, thereby creating the first spacer 222a that is higher than the first gate. It should be emphasized that the high spacer 222a prevents the salicide region subsequently formed upon the first gate 202 from laterally growing onto the sidewall of the first gate 202, especially when the first gate 202 is a PMOS gate.

Figure 1D:
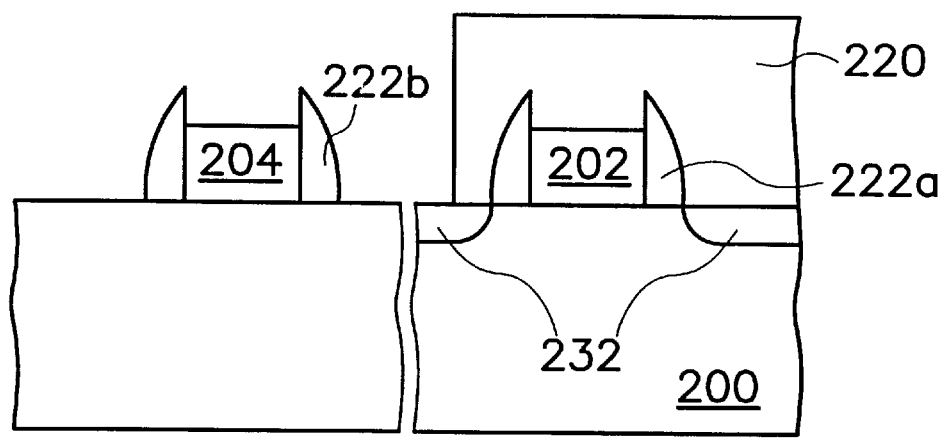

Referring to FIG. 1D, first heavily doped source/drain regions 232, for example, P-type heavily doped source/drain regions are formed in the substrate 200 adjacent to the first spacer 222a. This technique is well known to persons skilled in the art. After the first heavily doped source/drain regions 232 are formed, the first gate 202 and spacer 222a are masked with a photoresist pattern 220.

Figure 1E:
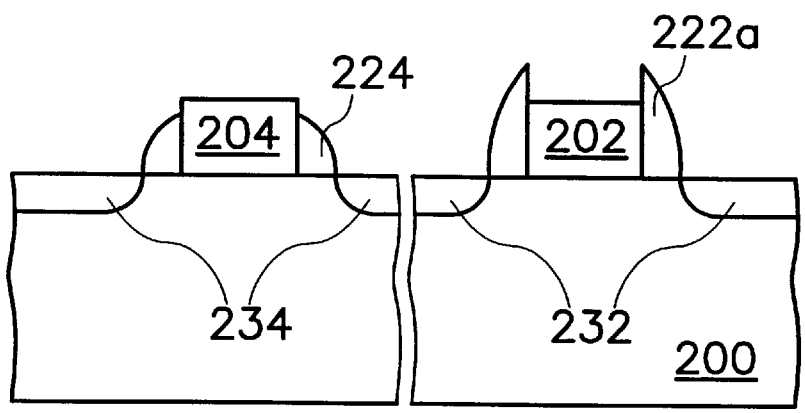

Referring to FIG. 1E, the second spacer 222b is etched back by using the photoresist pattern (220 shown in FIG. 1D) as an etching mask so as to form a third spacer 224 lower than the second gate. The second spacer 222b is etched back by, for example, anisotropically etching. Second heavily doped source/drain regions 234, for example, N-type heavily doped source/drain regions are formed in the substrate 200 adjacent to the second spacer (222b shown in FIG. 1D). This technique is well known to persons skilled in the art. It should be emphasized that the low spacer 224 exposes a small, upper part of the sidewall of the second gate 204 so as to leave more sites for forming a gate salicide region thereupon, especially when the second gate 204 is an NMOS gate.

Figure 1F:
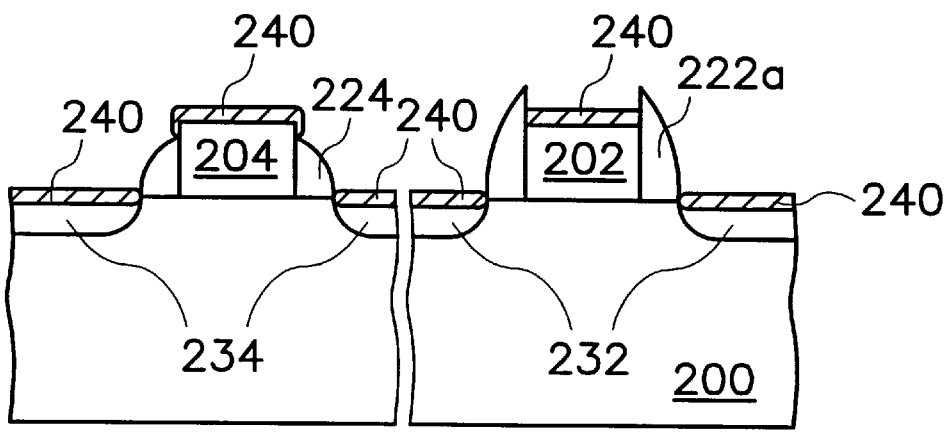

Referring to FIG. 1F, salicide layers 240 are formed upon the first gate 202, the second gate 204, the first heavily doped regions 232 and the second heavily doped regions 234. For example, a titanium (or platinum) metal layer (not shown) is formed on the substrate 200 to envelop the first gate 202, the second gate 204, the first heavily doped regions 232 and the second heavily doped regions 234. The metal layer reacts with the silicon material of its underlying layers at a temperature of between about 730° C. and 800° C., preferably between about 750° C. and 800° C. The metal layer over the first and the third spacers 222a, 224 is not reacted and then is removed. After the metal layer over the first and the third spacers 222a, 224 is removed, the desirable salicide layers 240 are accomplished.

In conclusion, the salicide process is performed well at a high temperature of between about 750° C. and 800° C., thereby decreasing the resistance of the MOS electrodes and the contact resistance of the contact regions between those electrodes.

The invention has been described using an exemplary preferred embodiment. However, it is to be understood that the scope of the invention is not limited to the disclosed embodiment. On the contrary, it is intended to cover various modifications and similar arrangements. For example, the material of stuffed film is not limited to the nitride silicon and titanium nitride. The material can comprises any one with an etching rate different from other surround materials. The scope of the claims, therefore, should be accorded the broadest interpretation so as to encompass all such modifications and similar arrangements.

What is claimed is:

1. A method for fabricating salicide devices over a substrate on which a first and a second gates are formed, comprising:

forming a first stuffed film on the first gate and a second stuffed film on the second gate;

forming a first spacer on the sidewall of the first gate and stuffed film;

forming a second spacer on the sidewall of the second gate and stuffed film;

removing the first and the second stuffed films;

etching back the second spacer so as to form a third spacer lower than the second gate; and forming a plurality of salicide layers upon the first and the second gates.

2. The method of claim 1, wherein the step of etching back the second spacer comprises:

masking the first spacer with a photoresist pattern;

anisotropically etching the second spacer by using the photoresist layer as an etching mask so as to form the third spacer; and removing the photoresist pattern.

3. The method of claim 1, wherein the first gate comprises a PMOS gate.

4. The method of claim 1, wherein the second gate comprises an NMOS gate.

5. The method of claim 1, wherein the stuffed film comprises a SiON layer.

6. A method of forming gate spacers, comprising:

forming a first spacer on the sidewalls of a first and a second gates on a substrate, wherein the first spacer is higher than the first gate, wherein the first gate is a PMOS gate; and selectively etching only the first spacer adjacent to the second gate so as to create a second spacer lower than the second gate, wherein the second gate is an NMOS gate.

* * * * *